(12) United States Patent
Hilal

(10) Patent No.: US 6,492,819 B1
(45) Date of Patent: Dec. 10, 2002

(54) HIGH VOLTAGE SWITCH AND SWITCHING PROCESS FOR IMPULSE MEASUREMENT

(75) Inventor: Nagi Mahmoud Hilal, Raleigh, NC (US)

(73) Assignee: ABB Inc., Raleigh, NC (US)

(*) Notice: Subject to any disclaimer, the term of this patent is extended or adjusted under 35 U.S.C. 154(b) by 0 days.

(21) Appl. No.: 09/759,568

(22) Filed: Jan. 12, 2001

(51) Int. Cl.⁷ .............................................. G01R 31/06
(52) U.S. Cl. ........................ 324/547; 324/537; 324/555
(58) Field of Search ................................ 324/547, 536, 324/537, 551; 200/48 R, 49

(56) References Cited

U.S. PATENT DOCUMENTS

| | | | |
|---|---|---|---|
| 3,189,818 A | 6/1965 | Frakes | 324/54 |
| 3,604,976 A | 9/1971 | Zajic | 315/191 |
| 3,794,798 A | 2/1974 | Trayer | 200/153 G |
| 4,147,975 A | 4/1979 | Pratsch et al. | 324/28 CB |
| 4,392,107 A | 7/1983 | Gollomp | 324/73 |
| 4,506,244 A | 3/1985 | Jabagchourian et al. | 335/151 |
| 4,543,523 A | 9/1985 | Moran | 324/51 |
| 4,779,051 A | 10/1988 | Grunewald et al. | 324/536 |
| 4,810,972 A | 3/1989 | Appleby, Jr. et al. | 324/541 |
| 4,866,391 A | 9/1989 | Latham, Jr. | 324/509 |
| 5,142,104 A | 8/1992 | McArdle | 174/74 R |
| 5,291,124 A | 3/1994 | Hoffman et al. | 324/72.5 |
| 5,514,967 A * | 5/1996 | Zelm | 324/551 |
| 5,560,474 A | 10/1996 | Thomas et al. | 200/48 A |

\* cited by examiner

*Primary Examiner*—Christine K. Oda
(74) *Attorney, Agent, or Firm*—Woodcock Washburn LLP

(57) ABSTRACT

A switching assembly for performing impulse measurement testing on each of a plurality of transformer terminals includes a first plurality of single pole, double throw switches and a switch controller for each switch. Each switch has a first position that connects a respective transformer terminal to one of a ground and a shunt and a second position that connects the terminal to an impulse generator. Preferably, the switch controllers are co-located to enable a user to change the position of any one of the switches from a central position.

12 Claims, 5 Drawing Sheets

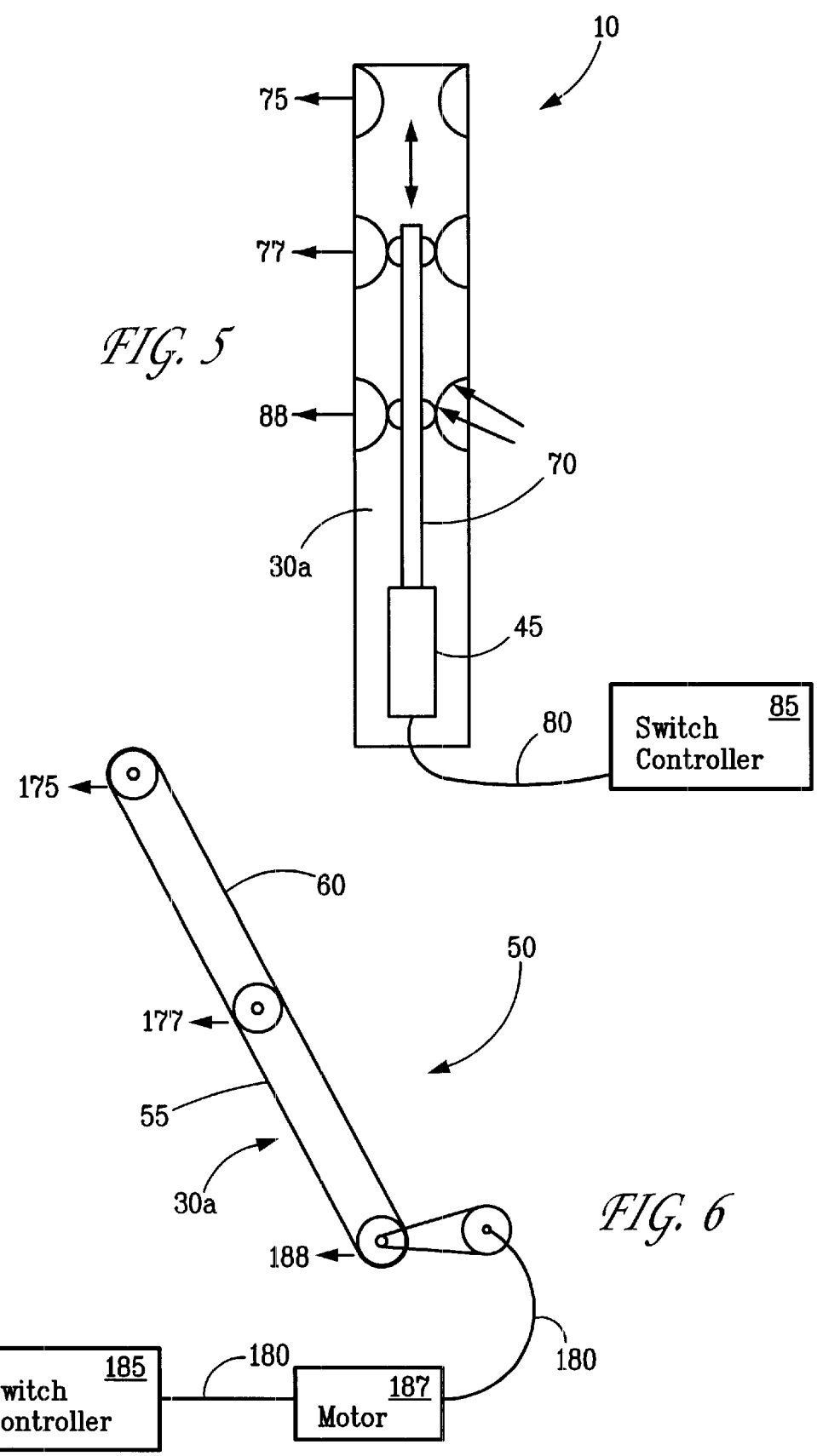

HIGH VOLTAGE SWITCH AND SWITCHING PROCESS FOR IMPULSE MEASUREMENT

FIELD OF THE INVENTION

The invention relates to an apparatus and method for transformer testing and more particularly to an apparatus and method for impulse measurement testing of transformer terminals.

BACKGROUND

Impulse measurement is a common testing practice in the manufacture of electrical transformers. Impulse measurement simulates lightning strikes and other events that cause transients to appear in electrical circuitry. Impulse measurement testing is performed on transformers to monitor the effects of transients and to insure the insulation capabilities of the dielectric material in the transformer. Impulse measurement testing requires that each individual terminal of a transformer be 'hit' with impulses of varying degree to determine whether that particular terminal is in proper working order and ready for shipment to the consumer.

Impulse measurement testing is done by connecting one of the transformer terminals to an impulse generator and the remaining terminals to either a shunt to ground or directly to ground. Then, an impulse is sent through the terminal and proper measurements are taken to determine if the terminal met the test criteria. The impulse generator is then moved to another terminal and the previously tested terminal is connected to either a grounded shunt or ground with the remaining terminals. An impulse is then sent to the second terminal and measurements are again taken for that terminal. This process is repeated until all terminals are tested.

The terminals that are not being tested can be connected either directly to ground or through a resistive shunt to ground (grounded shunt). The nature of the tested terminal determines which terminals are connected to the grounded shunt or directly to ground. If the tested terminal is a high voltage terminal, then the remaining high voltage terminals are connected to ground through the resistive shunt and all of the low voltage terminals are grounded directly. If the tested terminal is a low voltage terminal, then the remaining low voltage terminals are connected to through the resistive shunt to ground and all the high voltage terminals are grounded directly.

Impulse measurement testing takes about 6–8 hours to complete. There are several reasons why impulse measurement testing is so time consuming. One reason is that testers are required to manually connect and reconnect equipment between terminals. On large transformers, due to the size, testers must walk up and down a flight of stairs or a ladder to connect and reconnect the terminals. The connecting and reconnecting process consumes about 80% of the testing time. Therefore, a decrease in the connecting/reconnecting time would significantly reduce the overall testing time.

Another reason is the device used to test the medium or large transformers is also large and can not be easily handled by one person, thus requiring multiple manhours at a time to complete.

For the foregoing reasons, there is a need for a device and/or process that reduces testing time by overcoming the aforementioned disadvantages. The present invention satisfies all these needs.

SUMMARY

The present invention is directed to a switching assembly and related process that satisfies the need of reducing switching time during impulse measurement testing to decrease the overall cycle time of a transformer. Reduced switching time is achieved because the assembly can be assembled and disassembled by one person, it can be broken down into various units that are easily carried by one person, and all switching can be done from a central point.

According to the present invention, a switch assembly for performing impulse testing on each of a plurality of terminals of a transformer comprises a plurality of single pole, double throw switches and a switch controller for each switch. Each switch has a first position that connects a respective transformer terminal to one of a ground and a shunt and a second position that connects the terminal to an impulse generator. Preferably, the switch controllers are co-located to enable a user to change the position of any one of the switches from a central position.

BRIEF DESCRIPTION OF THE DRAWINGS

The foregoing summary, as well as the following detailed description of the preferred embodiments, is better understood when read in conjunction with the attached drawings. For the purpose of illustrating the invention, there is shown in the drawings embodiments that are presently preferred, it being understood, however, that the invention is not limited to the specific apparatus, system, and instrumentalities disclosed.

FIG. 5 shows one housing unit of the switching assembly of FIG. 1;

FIG. 6 is another embodiment of a switch according to a preferred embodiment of the present invention.

DETAILED DESCRIPTION

Figure 1:
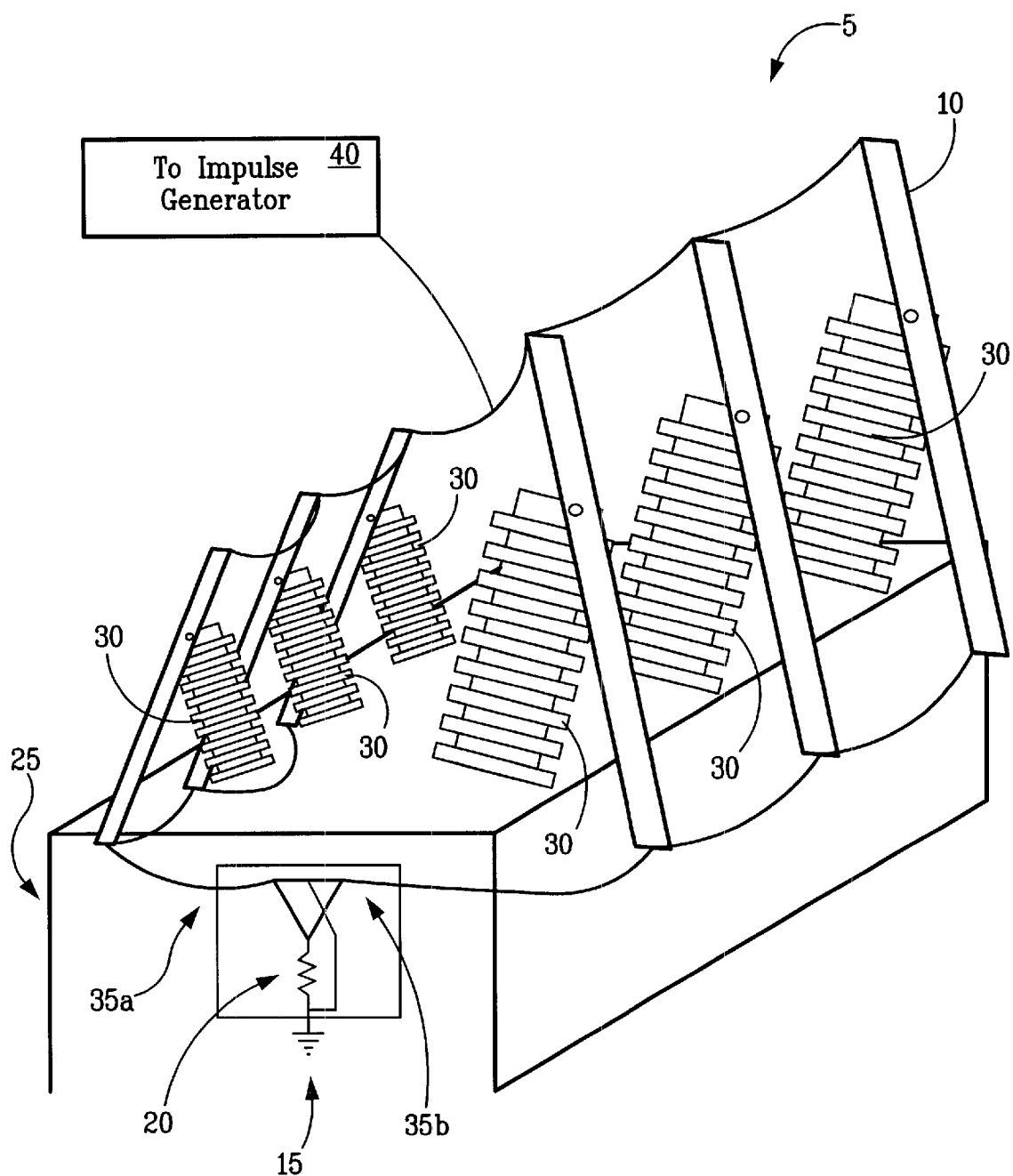
FIG. 1 is a perspective view of an embodiment of the switching assembly of the present invention as connected to a transformer.

Referring to the drawings wherein like numerals represent like elements throughout, there is shown in FIG. 1 an embodiment of the present invention connected to a transformer 25 during impulse measurement. The switching assembly 5 is connected to each terminal 30 of the transformer 25. The switch assembly 5 comprises a first plurality of single pole, double throw (SPDT) switches described hereinafter. Each switch has a first position that connects a respective transformer terminal 30 to one of a ground 15 and a shunt 20 and a second position that connects said terminal 30 to an impulse generator 40.

The switch assembly 5 further comprises a switch controller (not shown). As described more fully below, the switch controller is adapted to change the position of any one of the switches from a central position.

Each of the first plurality switches (not shown) is encased in a respective housing unit 10. Preferably, the housing units 10 are made of a lightweight durable plastic, such as, for example PVC. In other embodiments, however, any suitable materials can be used such as, for example, graphite, titanium, steel and the like, without departing from the spirit and scope of the present invention.

In the present embodiment, each housing unit 10 is "pipe like" or cylindrical in shape. Other shapes can be envisioned however, such as, for example, rectangular without departing from the principles of the present invention. Preferably, the shape and material of the housing units 10 is selected to make the assembly 5 convenient to carry, assemble and disassemble.

Figure 2:
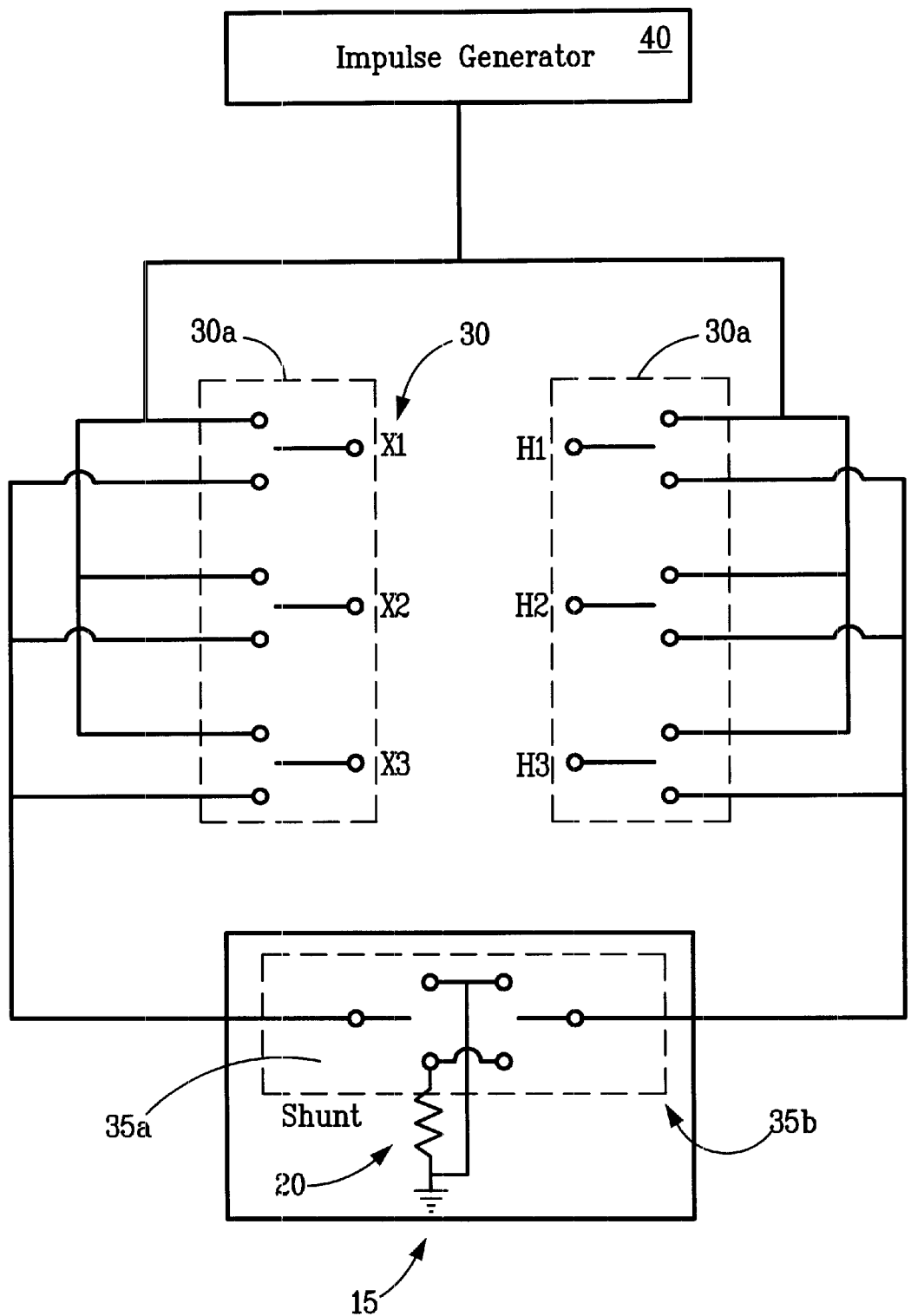
FIG. 2 is a schematic diagram illustrating one embodiment of a switching assembly of the present invention.

FIG. 2 is a schematic diagram of the switching assembly of FIG. 1 in accordance with the present invention. The circuit comprises, inter alia, two sets of SPDT switches, the terminal switches 30*a* and ground switches 35. In combination, the two sets connect the transformer terminals 30 between the impulse generator 40 or the grounded shunt 20 and ground 15.

SPDT switches are commonly referred to as 'three way' switches. This kind of switch makes or breaks the connection of a single conductor with either of two other single conductors. As mentioned above, preferably, the present invention has two sets of SPDT switches. One set of SPDT switches, referred to as terminal switches 30*a*, make or break the connection of each transformer terminal 30 with either the impulse generator 40 or the grounded shunt 20 or ground 15. Each SPDT switch 30*a* is contained in a respective housing unit 10.

The other set of switches, called ground switches 35*a*, 35*b* may be contained in a separate housing unit (not shown) having all the features of the housing unit for the terminal switches including, but not limited to, shape and material. The ground switches make or break the connection of each transformer terminal 30 with either ground 15 or the grounded shunt 20. In FIG. 2, none of the switches 30*a* or 35 are closed. This is the state of the switches prior to testing.

Figure 3:
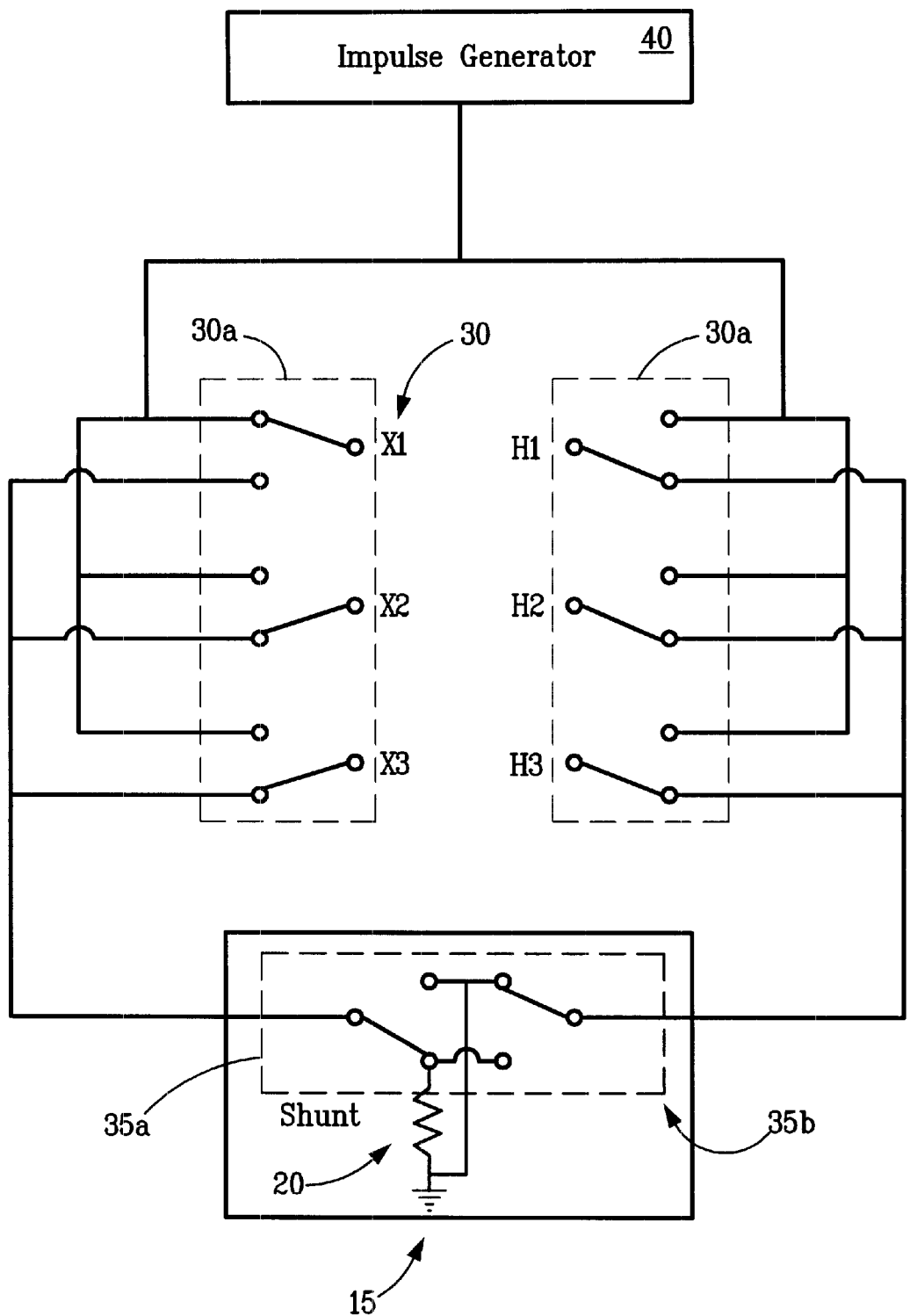
FIG. 3 is another schematic diagram showing the switches of the switching assembly in a different position.

FIG. 3 shows the same switching assembly as FIG. 2 but with one transformer terminal 30 in the test position. Specifically, transformer terminal X1 is being tested, i.e., connected to the impulse generator 40. Since X1 is the tested terminal, X2 and X3 are connected to the grounded shunt 20 via switch 35*a* and H1, H2 and H3 are connected to ground 15 via switch 35*b*.

Figure 4:
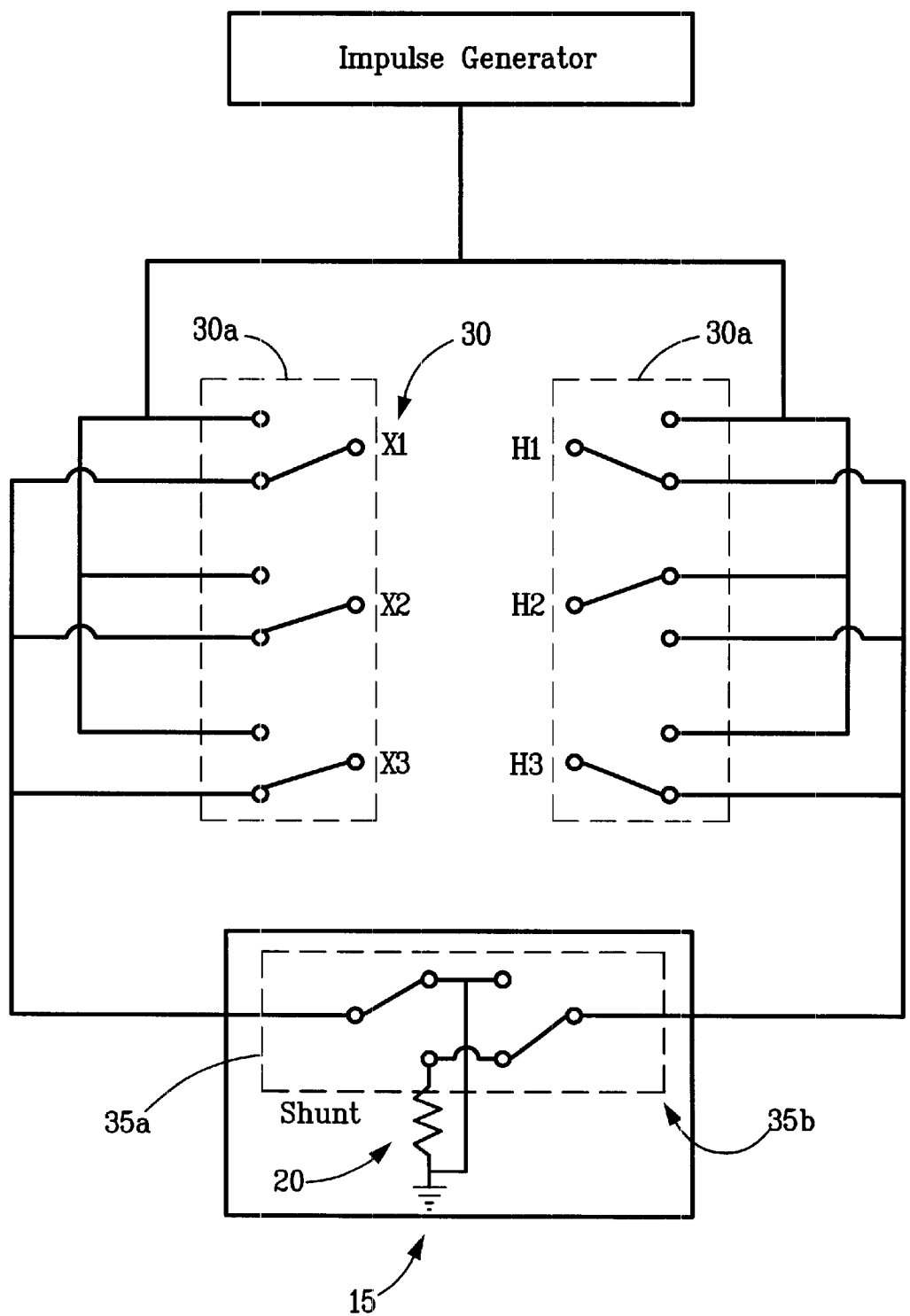
FIG. 4 is another schematic diagram showing the switches of the switching assembly in yet another position.

FIG. 4 shows the same switching assembly as in FIG. 2 and 3 but with a different transformer terminal 30 in the test position. In FIG. 4, transformer terminal H2 is being tested, i.e., connected to the impulse generator 40. Since H2 is the tested terminal, H1 and H3 are connected to the grounded shunt 20 via switch 35*b* and X1, X2 and X3 are connected to ground 15 via switch 35*a*.

FIG. 5 provides further details of the structure of a single SPDT switch 30*a* in accordance with one embodiment of the present invention. As shown, the three way switch 30*a* is contained in a housing unit 10. The switch 30*a* comprises three contacts, a transformer terminal contact 77, a ground/shunt contact 88 and an impulse generator contact 75. A linear actuator 45 activates the switch 30*a*. In a first position, the linear actuator 45 causes the switch 30*a* to connect a respective transformer terminal 30 to one of a ground 15 and a grounded shunt 20. In a second position, the linear actuator 45 causes the switch to connect the transformer terminal 30 to an impulse generator 40.

In a preferred embodiment, the linear actuator 45 is a pneumatic type actuator. However, other types of linear actuators 45 can be used such as, for example, an electric linear actuator, without departing from the principles of the present invention.

In the preferred embodiment, the linear actuator 45 is made of an insulative material to avoid surface breakdown. Most preferably, the material of the linear actuator shaft 70 is composed of micarta. However, any suitable insulating material can be used such as, for example, fiberglass or the like, without departing from the principles of the present invention.

Also shown in FIG. 5 is a switch controller 85. The switch controller enables the user to activate the switch from a distance. The switch controller is connected to the actuator 45 by a wire 80. Each terminal switch 30*a* has a switch controller 85 attached. Preferably, all of the switch controllers 85 are located in a single switch controller box (not shown). The switch controller box enables the operator to actuate each terminal switch 30*a* independently from a central location. This prevents the user from wasting valuable testing time in manually connecting and reconnecting equipment to the transformer terminals. Preferably, the controller box for the switch controllers 85 is co-located with controls (not shown) for switches 35*a* and 35*b*.

FIG. 6 shows an alternative embodiment of a three way switch 30*a*' that can be used in place of the switch 30*a* of FIG. 5. The switch 30*a*' is activated by a pulley system 50. The pulley system 50 comprises three contacts, a transformer terminal contact 177, a ground/shunt contact 188 and an impulse generator contact 175. The pulley system 50 has a belt 55 that contains a conductive portion 60 and a nonconductive portion 65 used to connect transformer terminals 30 to ground 15 and the impulse generator 40 via their respective contacts. The belt 55 moves between the impulse generator contacts 80 and the ground/shunt contact 85 to allow the impulse measurement to be performed. Specifically, in a first position, the belt 55 connects a respective transformer terminal 30 to one of a ground 15 and a grounded shunt 20. In a second position, the belt 55 connects the transformer terminal 30 to an impulse generator 40.

Any suitable material that exhibits conductive properties can be used for the conductive portion 60 of the belt 55, such as, for example, copper, aluminum or the like. Additionally, any suitable material that exhibits insulative properties can be used for the nonconductive portion 65 of the belt 55, such as, for example, rubber, polymers, or rubber and fabric combination or the like.

FIG. 6 also shows a switch controller 185. The switch controller 185 is connected to a motor 187. When activated by the switch controller 185, the motor 187 will drive the pulley system 50 and actuate the switch 30*a*'. Other means of driving the pulley system can be used such as, for example manually, pneumatically or the like without departing from the principles of the present invention. A wire 180 connects the pulley system 50, motor 187, and switch controller 185.

In use, prior to the impulse measurement test, a user connects the terminal switches and the ground switches to a transformer under test. The user connects each of the terminal switches of the switching assembly 5 to the respective terminals of the transformer. More specifically, the user connects each transformer terminal 30 to the transformer terminal contact (77, 177) of the terminal switch (30*a*, 30*a*'). The user then connects the impulse generator 40 to the impulse generator contact (75, 175) of the terminal switch (30*a*, 30*a*') and also connects the shunt/ground line 110 to the ground contact (88, 188) of the terminal switch (30*a*, 30*a*').

The user also connects the ground/shunt switches (35*a*, 35*b*). The ground/shunt switches (35*a*, 35*b*) are connected to ground 15, the grounded shunt 20 and to the transformer terminal 30. The combination of the terminal switches 30*a* and the ground/shunt switches (35*a*, 35*b*) allow the user to control the position of the switches in the assembly among the terminals 30, impulse generator 40 and ground 15/shunt 20 from a central location.

Once all the connections are made, the user may perform the impulse measurement test and read and record any pertinent data. When testing of one transformer terminal 30 is complete, the user may, from one location, switch the terminals 30 in any position the test requires and continue to test until all the transformer terminals 30 have been tested. The switching can be done from a central location with a switch controller box that contains a switch controller for each terminal and ground/shunt switch. This reduces the testing time because after each terminal 30 has been tested the user does not need to physically switch equipment between the terminals 30.

As the foregoing illustrates, the present invention is directed to a switching assembly for impulse measurement and a method of using the same. It is understood that changes may be made to the embodiments described above without departing from the broad inventive concepts thereof. For example, the shape or the material of the housing units may be altered without departing from the principles of the present invention. Therefore, the spirit and scope of the appended claims should not be limited to the description of the preferred embodiment contained herein.

What is claimed is:

1. A switch assembly for performing impulse measurement testing on each of a plurality of transformer terminals, said assembly comprising:
   a first plurality of single pole, double throw switches, each said switch having a first position that connects a respective transformer terminal to one of a ground and a shunt and a second position that connects the terminal to an impulse generator; and
   a switch controller for each switch that enables the position of the switch to be changed independently of the others.

2. The switch assembly of claim 1, wherein the switch controllers are co-located at a central location.

3. The switch assembly of claim 1, wherein each said switch is encased within a respective housing unit.

4. The switch assembly of claim 1, wherein said switch assembly further comprises a second plurality of ground/shunt switches that selectively connect said terminals to one of said ground and said shunt when said first plurality of switches is in said first position.

5. The switch assembly of claim 1, wherein each of said first plurality of switches is activated by a linear actuator.

6. The switch assembly of claim 1, wherein each of said first plurality of switches is activated by a pulley system comprising a belt having a conductive portion and a non conductive portion used to connect terminals of said transformer to either a ground/shunt or said impulse generator.

7. The switch assembly of claim 3, wherein each said housing unit is cylindrical in shape.

8. The switch assembly of claim 3, wherein each said housing unit is made of plastic.

9. The switch assembly of claim 5, wherein the shaft of each said actuator is composed of an insulating material.

10. The switch assembly of claim 9, wherein the insulating material comprises one of fiber glass and micarta.

11. A method of testing a transformer having a plurality of terminals using a switch assembly comprising a plurality of single pole, double throw (SPDT) switches, each said switch having a respective switch controller, said method comprising the steps of:
    (a) for each said SPDT switch,
       (a1) connecting a common terminal of said switch to a respective transformer terminal;
       (a2) connecting a second terminal of said switch to one of a ground and a shunt;
       (a3) connecting a third terminal of said switch to the impulse generator;
    (b) operating the switch controllers to switch a selected one of said transformer terminals to said impulse generator and the others to one of the ground and shunt; and
    (c) performing an impulse measurement test on said selected transformer terminal.

12. The method of claim 11, wherein said steps (b) and (c) are repeated for each said transformer terminal until all of said plurality of transformer terminals have been tested.

* * * * *